(12) United States Patent
Murata et al.

(10) Patent No.: US 8,465,859 B2
(45) Date of Patent: Jun. 18, 2013

(54) CURRENT SENSOR

(75) Inventors: Masatoshi Murata, Miyagi-ken (JP);
Manabu Tamura, Miyagi-ken (JP);
Shinji Mitsuya, Miyagi-ken (JP);
Hiroyuki Hebiguchi, Miyagi-ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 2 days.

(21) Appl. No.: 13/531,445

(22) Filed: Jun. 22, 2012

(65) Prior Publication Data
US 2012/0263985 A1 Oct. 18, 2012

Related U.S. Application Data

(63) Continuation of application No. PCT/JP2011/052657, filed on Feb. 8, 2011.

(30) Foreign Application Priority Data

Feb. 23, 2010 (JP) ................................ 2010-037456

(51) Int. Cl.
*G01R 19/00* (2006.01)
*H01M 10/48* (2006.01)

(52) U.S. Cl.
USPC ........ 429/90; 324/252; 324/207.21; 320/149; 320/157; 320/158; 320/159; 320/160; 320/162; 320/163; 320/164; 320/165; 320/161; 702/38; 702/64; 702/115; 361/79; 361/87; 361/86; 361/93.1; 361/93.6; 340/547; 340/643; 340/664

(58) Field of Classification Search
USPC .......................................................... 429/90
See application file for complete search history.

(56) References Cited

U.S. PATENT DOCUMENTS

2011/0221436 A1* 9/2011 Ichinohe et al. .............. 324/252

FOREIGN PATENT DOCUMENTS

| JP | 2002-243816 | | 8/2002 |
|---|---|---|---|
| JP | 2007-78416 | | 3/2007 |
| JP | 2007078416 A | * | 3/2007 |
| JP | 2007-163424 | | 6/2007 |

OTHER PUBLICATIONS

International Search Report dated May 10, 2011 from International Application No. PCT/JP2011/052657.

* cited by examiner

*Primary Examiner* — Milton I Cano
*Assistant Examiner* — Deneen Gaynor
(74) *Attorney, Agent, or Firm* — Beyer Law Group LLP

(57) ABSTRACT

A current sensor includes a magnetic balance sensor and a switching circuit. The magnetic balance sensor includes a feedback coil which is disposed near a magnetic sensor element varying in characteristics due to application of an induction field caused by measurement current and which produces a canceling magnetic field canceling the induction field. The switching circuit switches between magnetic proportional detection and magnetic balance detection. The magnetic proportional detection is configured to output a voltage difference as a sensor output. The magnetic balance detection is configured to output, as a sensor output, a value corresponding to current flowing through the feedback coil when a balanced state in which the induction field and the canceling magnetic field cancel each other out is reached after the feedback coil is energized by the voltage difference.

13 Claims, 7 Drawing Sheets

CURRENT SENSOR

CLAIM OF PRIORITY

This application is a Continuation of International Application No. PCT/JP2011/052657 filed on Feb. 8, 2011, which claims benefit of Japanese Patent Application No. 2010-037456 filed on Feb. 23, 2010. The entire contents of each application noted above are hereby incorporated by reference.

BACKGROUND OF THE INVENTION

1. Field of the Invention

The present invention relates to current sensors which detect current in a wide measurement range with high precision and with low power consumption.

2. Description of the Related Art

For example, current sensors measure the magnitude of current for driving motors in electric cars. The current sensors include a magnetic proportional current sensor (open-loop current sensor) and a magnetic balance current sensor (closed-loop current sensor). In a magnetic proportional current sensor, a magnetic field which is proportional to measurement current occurs in a core gap due to magnetic lines of force which are produced in a core made from a magnetic substance, and a magnetic detection device converts this magnetic field into a voltage signal to produce an output voltage that is proportional to the measurement current. In contrast, in a magnetic balance current sensor, when measurement current flows, a magnetic detection device produces an output voltage due to a magnetic field depending on the current. The magnetic detection device outputs a voltage signal which is converted into current so that the current is fed back to a feedback coil. The feedback coil produces a magnetic field (canceling magnetic field), and the canceling magnetic field and the magnetic field produced by the measurement current cancel each other out so that the resulting magnitude of the magnetic fields is constantly equal to zero. The current sensor converts the feedback current which flows through the feedback coil at that time into a voltage to output the resulting voltage.

A magnetoresistive element, such as a Hall element or a giant magneto resistance (GMR) element, is used as a magnetic detection device in the above-described current sensor. A magnetic proportional current sensor using a Hall element as a magnetic detection device, when used in a wider measurement range, has a low resolution for a small measurement current. In contrast, a magnetic balance current sensor using a Hall element as a magnetic detection device fails to cancel the magnetic field produced by a large amount of current. Thus, a method for compensating for the drawbacks of the two types of current sensors is disclosed in Japanese Unexamined Patent Application Publication No. 2007-78416 which describes a method in which a magnetic proportional current sensor using a Hall element and a magnetic balance current sensor using a Hall element are disposed so as to be used by switching therebetween in accordance with the magnitude of measurement current.

However, in the technique disclosed in Japanese Unexamined Patent Application Publication No. 2007-78416, it is necessary to prepare two types of current sensors separately, resulting in failure to achieve space saving and in a complicated manufacturing process. Furthermore, in the technique disclosed in Japanese Unexamined Patent Application Publication No. 2007-78416, in the case where the measurement current is large, magnetic saturation occurs when a GMR element is used as a magnetic detection device because the magnetic balance is disturbed in the magnetic balance current sensor which is not being used. Thus, in the case where the technique disclosed in Japanese Unexamined Patent Application Publication No. 2007-78416 is used, some magnetic detection devices do not enable measurement to be performed in a wide measurement range with high precision.

SUMMARY OF THE INVENTION

The present invention has been made in view of the above-described issues. The present invention provides a current sensor which achieves compatibility between high-precision measurement in a wide measurement range and power saving and which also achieves space saving.

According to a first aspect of the present invention, a current sensor includes a magnetic balance sensor and switching means. The magnetic balance sensor includes a feedback coil which is disposed near a magnetic sensor element varying in characteristics due to an induction field caused by measurement current and which produces a canceling magnetic field canceling the induction field. The switching means is provided for switching between magnetic proportional detection and magnetic balance detection. The magnetic proportional detection is configured to output a voltage difference as a sensor output. The magnetic balance detection is configured to output, as a sensor output, a value corresponding to current flowing through the feedback coil when a balanced state in which the induction field and the canceling magnetic field cancel each other out is reached after the feedback coil is energized by the voltage difference.

This configuration allows a single current sensor to switch between the magnetic proportional detection and the magnetic balance detection, achieving compatibility between a wide measurement range usable in the magnetic balance system and power saving. In particular, the present invention is effective for a current sensor using a magnetoresistive element which has a configuration in which a feedback coil is disposed close to the magnetoresistive element.

According to a second aspect of the present invention, a current sensor includes two current sensors, each of the two current sensors being the current sensor according to the first aspect, disposed so as to face each other with a conductor interposed therebetween. The conductor is configured in such a manner that the measurement current flows through the conductor. It is preferable that sensing axis directions of the magnetic sensor elements in the two current sensors be identical. This configuration allows the influence of an external magnetic field such as that of the earth to be canceled by a differential output between the two magnetic balance sensors, achieving measurement of current with high precision.

It is preferable that the switching means be provided for switching between the magnetic proportional detection and the magnetic balance detection in accordance with an external signal. This configuration enables the power consumption of the current sensor to be suppressed at any timing when a user wants to enter a power-saving state, such as a sleep mode.

It is preferable that the magnetic proportional detection be performed in a range of measurement current in which linearity of a magnetic characteristic of the magnetic sensor element is maintained.

It is preferable that the magnetic proportional detection be performed in a range of a relatively low measurement current.

It is preferable that a signal be output to the outside. The signal indicates whether the current sensor is in a state in which the magnetic proportional detection is performed or a state in which the magnetic balance detection is performed. This configuration enables the current mode of the current sensor to be checked.

It is preferable that the magnetic sensor element be a magnetoresistive element. This configuration enables the sensing axis to be easily disposed in a direction parallel to the substrate surface on which the current sensor is installed, and enables a planar coil to be used.

According a third aspect of the present invention, a battery includes a battery body provided with a current line, and the current sensor according to the first aspect attached to the current line.

A current sensor provided by the present invention includes a magnetic balance sensor and switching means. The a magnetic balance sensor includes a feedback coil which is disposed near a magnetic sensor element varying in characteristics due to an induction field caused by measurement current and which produces a canceling magnetic field canceling the induction field. The switching means is provided for switching between magnetic proportional detection and magnetic balance detection. The magnetic proportional detection is configured to output a voltage difference as a sensor output. The magnetic balance detection is configured to output, as a sensor output, a value corresponding to current flowing through the feedback coil when a balanced state in which the induction field and the canceling magnetic field cancel each other out is reached after the feedback coil is energized by the voltage difference. The magnetic proportional detection and the magnetic balance detection are performed by a single current sensor, achieving compatibility between high-precision measurement in a wide measurement range and power saving and also achieving space saving.

DESCRIPTION OF THE PREFERRED EMBODIMENTS

A magnetic proportional current sensor using a GMR element can measure a relatively small measurement current with high precision and with small power consumption. However, it is not possible for the magnetic proportional current sensor using a GMR element to be used for a large measurement current because magnetic saturation occurs in the GMR element due to the magnetic field caused by the measurement current and because output values obtained after the magnetic saturation occurs are not correct, resulting in a narrow measurement range for the measurement current. In contrast, a magnetic balance current sensor using a GMR element, which has a more complex configuration than that of the magnetic proportional current sensor, can measure a wide measurement range of measurement current with high precision. On the other hand, current needs to flow through a feedback coil continuously. Accordingly, when a small measurement current is measured, the power consumption is larger than those of other systems such as shunt resistors.

The inventors have focused on the above-described issues, and have come up with the present invention after finding out that high-precision measurement of measurement current in a wide range as well as power saving and space saving can be achieved by switching between magnetic balance detection and magnetic proportional detection so that power consumption is made as small as possible. In particular, magnetic proportional detection is used for measurement of a relatively small current, achieving small power consumption.

In other words, the gist of the present invention is that a current sensor includes a magnetic balance sensor and switching means, achieving compatibility between high-precision measurement in a wide measurement range and power saving and also achieving space saving. The magnetic balance sensor includes a feedback coil which is disposed near a magnetic sensor element varying in characteristics due to an induction field caused by measurement current and which produces a canceling magnetic field canceling the induction field. The switching means is provided for switching between magnetic proportional detection and magnetic balance detection. The magnetic proportional detection is configured to output a voltage difference as a sensor output. The magnetic balance detection is configured to output, as a sensor output, a value corresponding to current flowing through the feedback coil when a balanced state in which the induction field and the canceling magnetic field cancel each other out is reached after the feedback coil is energized by the voltage difference.

Embodiments of the present invention will be described in detail below with reference to the accompanying drawings.

First Embodiment

Figure 1:
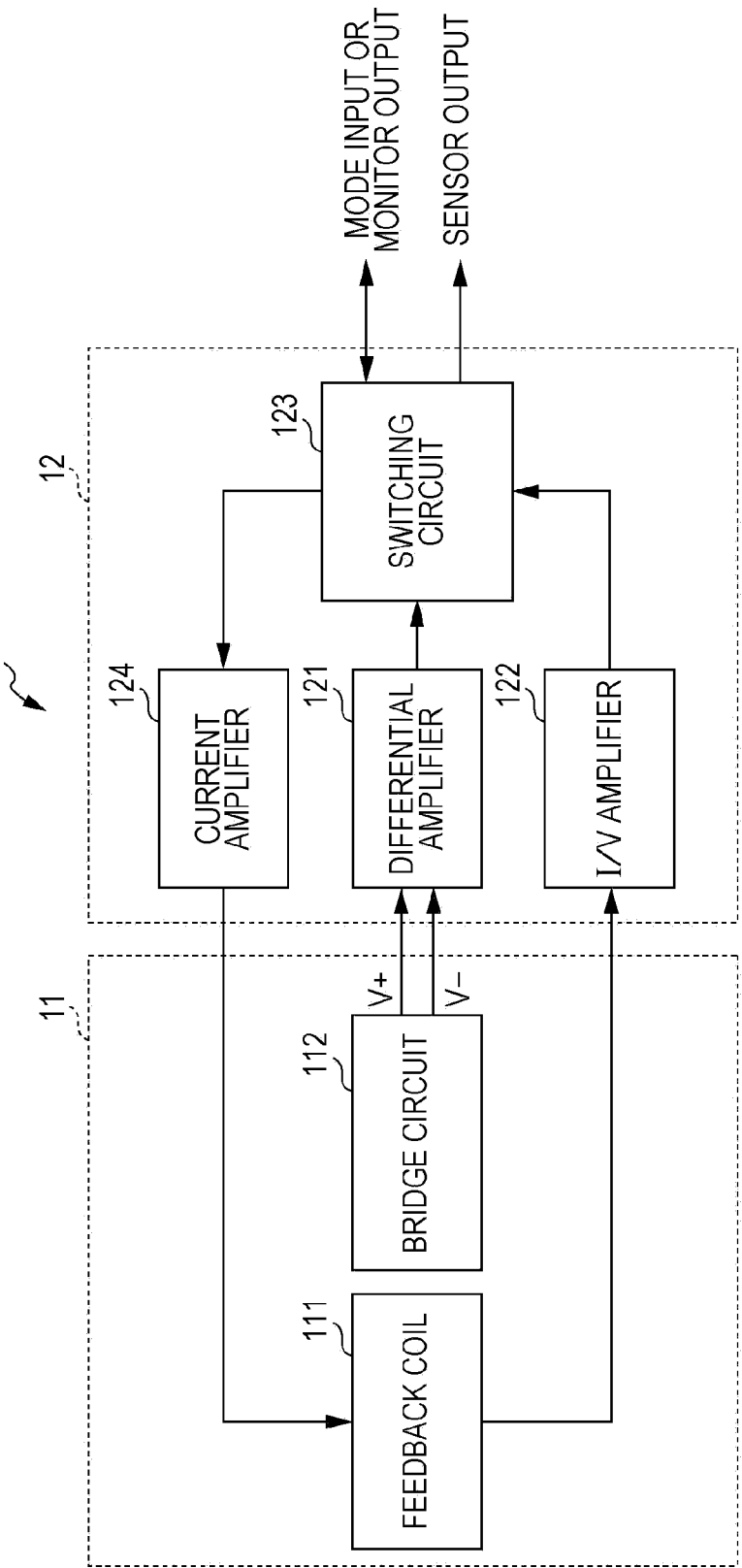
FIG. 1 is a diagram illustrating a current sensor according to a first embodiment of the present invention.

FIG. 1 is a diagram illustrating a current sensor according to a first embodiment of the present invention. In the first embodiment, a current sensor 1 illustrated in FIG. 1 is disposed near a current line through which measurement current flows. The current sensor 1 mainly includes a sensing unit 11 and a controller 12.

The sensing unit 11 includes a feedback coil 111 which is disposed in such a manner that a magnetic field can be produced in a direction in which a magnetic field caused by the measurement current is canceled, and a bridge circuit 112 which includes two magnetoresistive elements, which are magnetic detection devices, and two fixed resistance elements. The controller 12 includes a differential amplifier 121 which amplifies a differential output from the bridge circuit 112, a current amplifier 124 which controls feedback current through the feedback coil 111, an I/V amplifier 122 which converts the feedback current into voltage, and a switching circuit 123 which switches between the magnetic proportional detection and the magnetic balance detection.

The feedback coil 111 is disposed near the magnetoresistive elements in the bridge circuit 112, and produces a canceling magnetic field which cancels an induction field produced by the measurement current. Examples of the magnetoresistive elements in the bridge circuit 112 include a GMR element and a tunnel magneto resistance (TMR) element. The magnetoresistive elements vary in resistance due to application of the induction field caused by the measurement current. The two magnetoresistive elements and the two fixed resistance elements constitute the bridge circuit 112, thereby achieving a current sensor with high sensitivity. The bridge circuit 112 has two outputs with which a voltage difference is produced depending on the induction field caused by the measurement current. By using a magnetoresistive element, the sensing axis is easily disposed in a direction parallel to the substrate surface on which the current sensor is installed, enabling a planar coil to be used.

The bridge circuit 112 has two outputs with which a voltage difference is produced depending on the induction field caused by the measurement current. The differential amplifier 121 amplifies the two outputs of the bridge circuit 112. In a mode of the magnetic proportional detection (hereinafter, referred to as a magnetic proportional mode), the voltage difference in the differential amplifier 121 is adjusted in level to be output as a sensor output. In a mode of the magnetic balance detection (hrereinafter, referred to as a magnetic balance mode), the current amplifier 124 supplies the feedback coil 111 with the amplified output which has been converted into current, i.e., feedback current. This feedback current is produced in accordance with the voltage difference which depends on the induction field. At that time, the feedback coil 111 produces a canceling magnetic field which cancels the induction field. Then, the I/V amplifier 122 converts, into voltage, the current that flows through the feedback coil 111 when a balanced state is reached in which the induction field and the canceling magnetic field cancel each other out, and this voltage is output as a sensor output.

In the current amplifier 124, by setting the supply voltage to a value close to a value obtained through the following expression, the reference voltage for the I/V conversion+(the maximum value of the rating of the feedback coil resistance× the feedback coil current at full scale), the feedback current is automatically restricted, achieving an effect of protection of the magnetoresistive elements and the feedback coil. According to the embodiment, a differential between the two outputs in the bridge circuit 112 is amplified to be used for the feedback current. Alternatively, only a midpoint potential may be output from the bridge circuit 112, and the feedback current may be produced on the basis of the potential difference between the midpoint potential and a predetermined reference potential.

The switching circuit 123 switches between the magnetic proportional detection, in which the voltage difference from the differential amplifier 121 is used as a sensor output, and the magnetic balance detection, in which the feedback coil 111 is energized by the voltage difference and in which a value corresponding to the current which flows through the feedback coil 111 when a balanced state is reached in which the induction field and the canceling magnetic field cancel each other out is used as a sensor output. Thus, the switching circuit 123 controls circuits in such a manner that a magnetic field, i.e., a canceling magnetic field, which cancels the induction field caused by the measurement current which flows through the current line is produced in the magnetic balance mode and that the canceling magnetic field is not produced in the magnetic proportional mode. That is, the switching circuit 123 turns on/off the feedback current used in the magnetic balance mode.

As described above, when the magnetic proportional current sensor using a GMR element is used for a large measurement current, magnetic saturation occurs in the GMR element due to the magnetic field caused by the measurement current, resulting in a narrow measurement range for measurement current. When the magnetic balance current sensor using a GMR element is used for a small measurement current, the power consumption is larger than those of other systems such as shunt resistors. Accordingly, to achieve a wide measurement range as well as small power consumption, it is desirable that the magnetic proportional detection be used in a relatively low range of measurement current, and that the magnetic balance detection be used in a relatively high range of measurement current. In the magnetic proportional detection, a narrow measurement range of measurement current is caused by the magnetic saturation in the GMR element. Accordingly, it is desirable that the magnetic proportional detection be used in a range of measurement current in which the linearity in the magnetic characteristic of the magnetoresistive elements is maintained.

Therefore, the switching circuit 123 switches between the magnetic proportional detection and the magnetic balance detection, i.e., performs switching of a mode, on the basis of determination for measurement current using a threshold. Specifically, the magnetic proportional detection is used in a low measurement current range, and the magnetic balance detection is used in a measurement current range higher than the low measurement current range. In this case, it is desirable that, for example, the threshold for measurement current be set to a measurement current value with which the linearity in the magnetic characteristic of the magnetoresistive elements is maintained. Measurement current with which linearity in the magnetic characteristic of a magnetoresistive element is maintained depends on properties of the magnetoresistive element itself and a distance between the magnetoresistive element and a feedback coil. Accordingly, the threshold is set as appropriate in accordance with these factors. In addition, a threshold used to switch from the magnetic balance detection to the magnetic proportional detection is desirably set hysteretically to avoid frequent switching.

The switching circuit 123 may switch between the magnetic proportional detection and the magnetic balance detection in accordance with an external signal. This enables the power consumption of the current sensor to be suppressed at any timing when a user wants to enter a power-saving state, such as a sleep mode. In this case, a mode signal is input to the switching circuit 123 from the outside, that is, a mode input is received. In this case, it is desirable to prepare a protection function such as a function in which the mode is not actually switched when the measurement current which causes magnetic saturation in the GMR element flows. In addition, a mode output or the like described below may be also used so that the situation can be grasped better.

In the case where the mode is automatically switched, the switching circuit 123 may output, to the outside, information about which mode is being used to measure the measurement current, i.e., a signal indicating whether the magnetic proportional detection or the magnetic balance detection is being used. This enables the current mode of the current sensor to be checked. In this case, the switching circuit 123 is connectable to an external monitor. In the case where the switching circuit 123 automatically switches the mode, the switching circuit 123 may perform the determination for measurement current using a threshold, and switch the mode on the basis of the result. Alternatively, the switching circuit 123 may switch the mode on the basis of information obtained from an apparatus in which the current sensor is installed.

Figure 2:
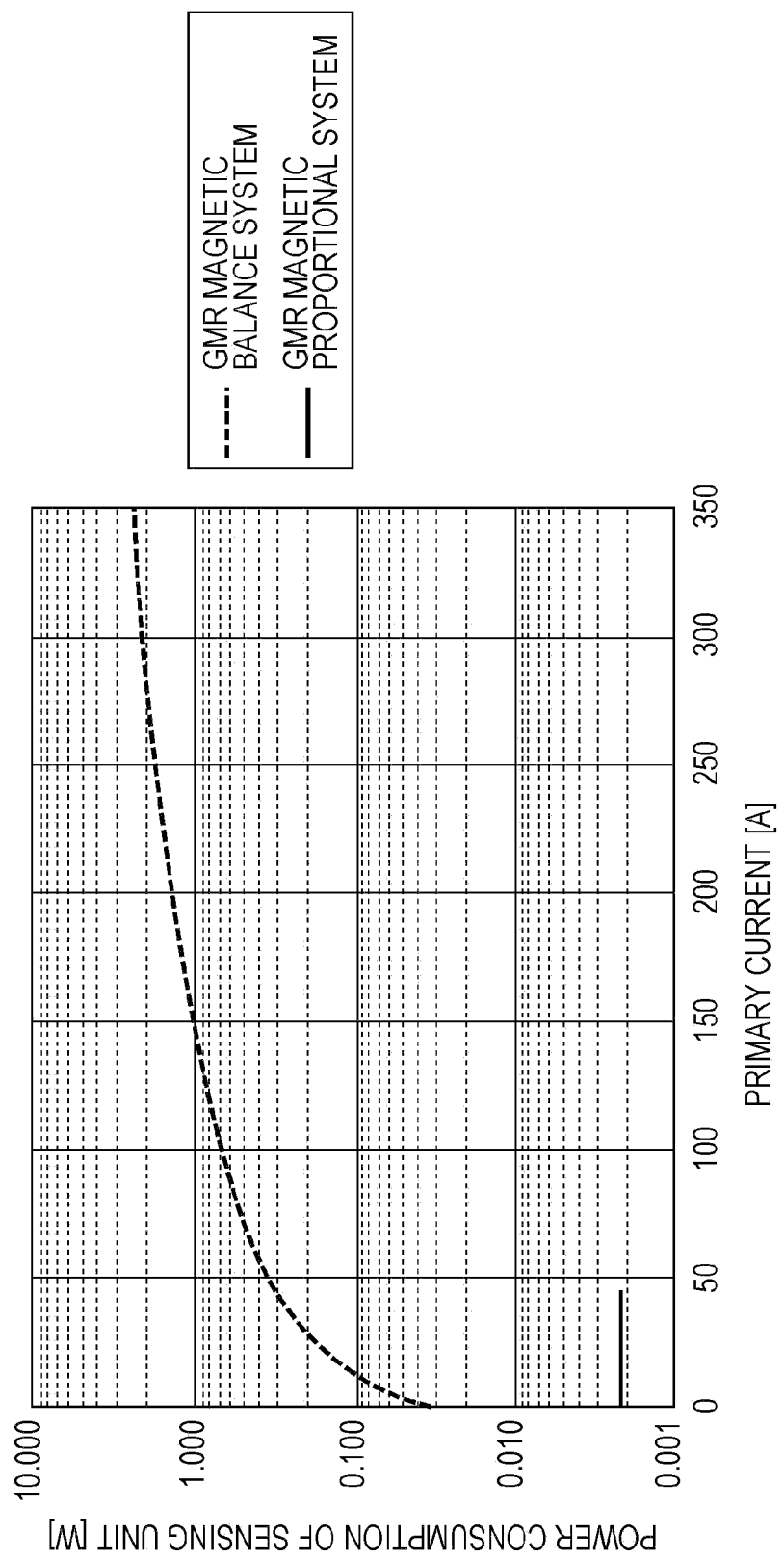
FIG. 2 is a diagram illustrating exemplary power consumptions of a magnetic proportional current sensor and a magnetic balance current sensor.

Now, an example of switching between the magnetic proportional detection and the magnetic balance detection in the current sensor according to the embodiment of the present invention will be described. FIG. 2 illustrates exemplary power consumptions of a magnetic balance current sensor using a GMR element, i.e., a GMR magnetic balance system, and a magnetic proportional current sensor using a GMR element, i.e., a GMR magnetic proportional system. As described above, when the GMR magnetic balance system is used for a small measurement current, the power consumption is larger than those of other systems such as shunt resistors. In contrast, it is not possible for the GMR magnetic proportional system to be used for a large measurement current because magnetic saturation occurs in the GMR element due to the magnetic field caused by the measurement current and because output values obtained after the magnetic saturation occurs are not correct. Furthermore, the GMR magnetic proportional system directly uses a (nonlinear) characteristic of a GMR element which exhibits hysteresis. Accordingly, a usable range of the current sensor is limited approximately to a range in which linearity is present and which is up to a little less than 10% of the saturation magnetic field. In FIG. 2, the range in which linearity is present is approximately up to 40 A in terms of measurement current.

An example will be described in which the current sensor according to the embodiment of the present invention is applied to a battery current sensor in an electric car or a hybrid car, which is regarded as an example in which a large current mode and a small current mode that is other than the large current mode are clearly separated from each other during operation. For example, a hybrid car has a motor having a rating of 60 kW, 28 batteries connected in series, and a voltage of 201.6 V. In this case, a battery current of approximately 300 A flows during the rated operation of the motor. In contrast, the power consumption required while the car is being stopped depends mainly on electric components. The total of the power consumptions for the electric components is 87 A (12 V), which corresponds approximately to 5 A in terms of the battery current after current-voltage conversion.

As a threshold used to switch the current sensor from the magnetic proportional detection to the magnetic balance detection, a value of 20 A which is approximately 50% of the usable range for the magnetic proportional detection is selected so that an allowance is present. This value is much larger than the above-described value of 5 A, and is much smaller than the above-described value of 300 A. In terms of a response speed, for example, in the case where a time period of 1 µs as is required until the feedback current is stabilized after the feedback current turns on, with consideration of the usable range for the magnetic proportional detection which is up to 40 A, a current change up to 20 A/1 µs=20 A/µs can be addressed. In a system in which a current change faster than this occurs, a threshold which allows a larger allowance may be set through similar consideration. In contrast, as a threshold used to switch from the magnetic balance detection to the magnetic proportional detection, hysteresis is provided to avoid frequent switching and, for example, a value of 10 A may be selected which is moderately apart from the values of 20 A and 5 A.

Figure 3:
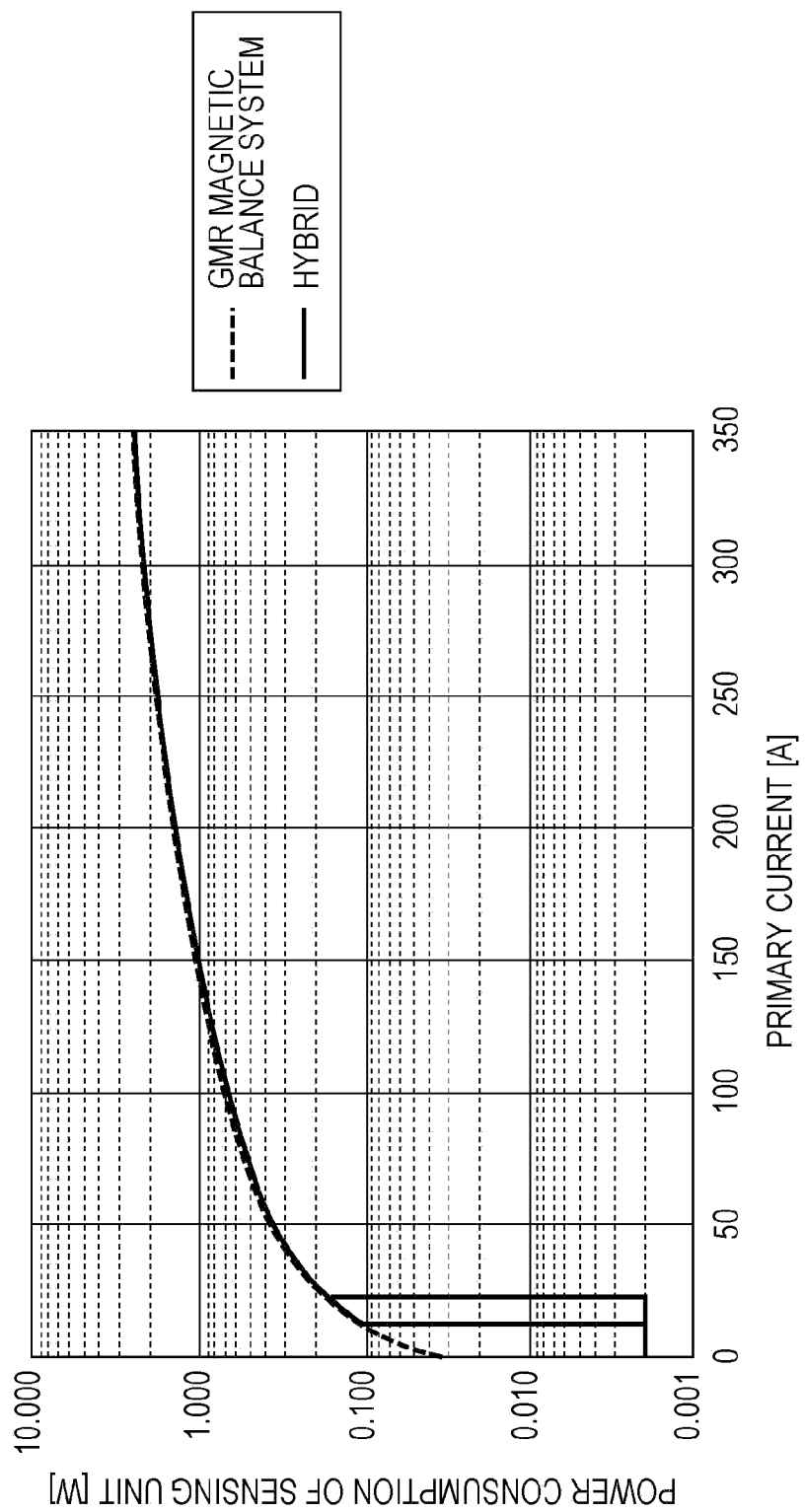
FIG. 3 is a diagram illustrating an exemplary power consumption of a current sensor according to the embodiment of the present invention.
Figure 4:
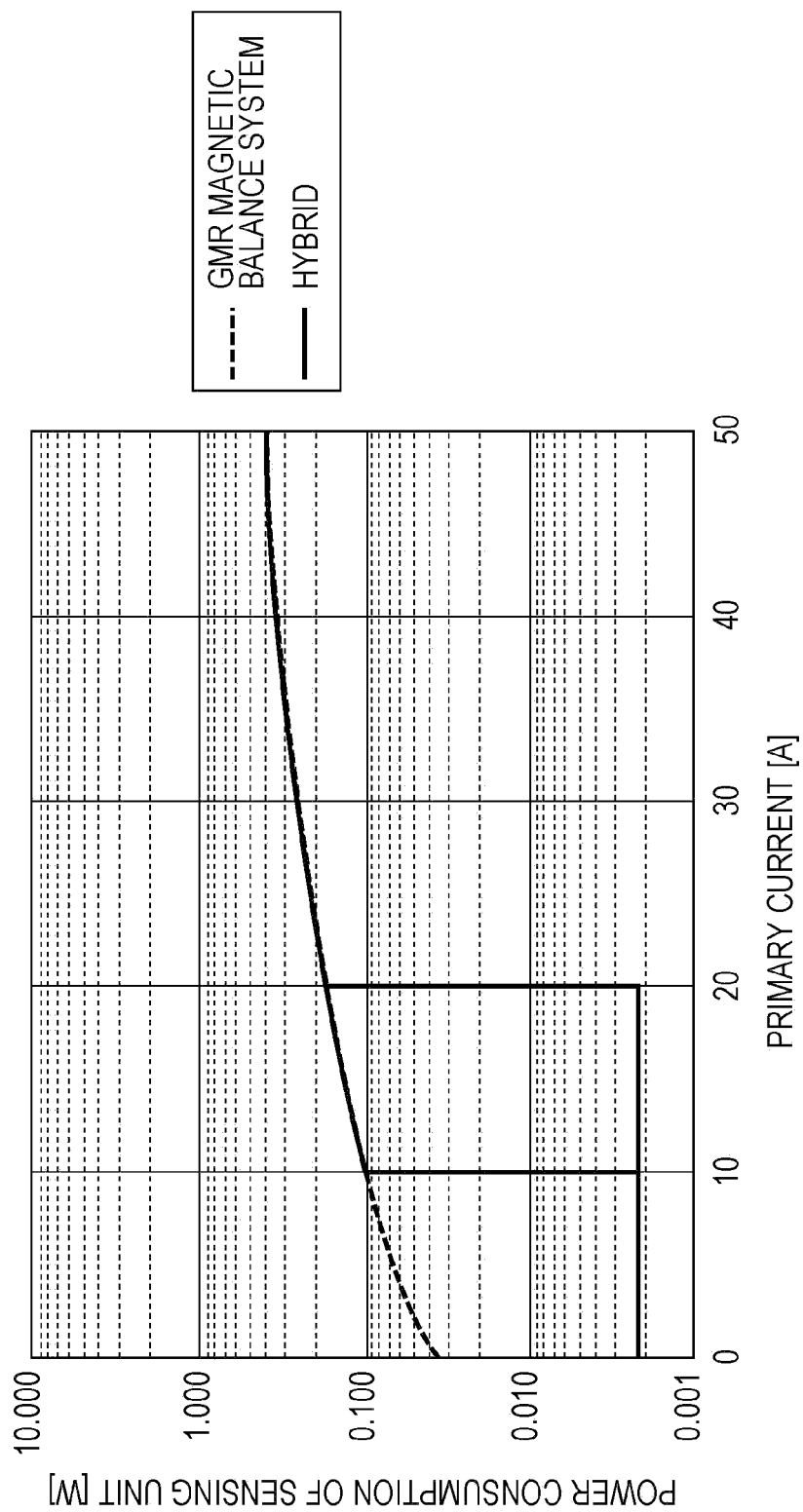
FIG. 4 is a diagram illustrating an exemplary power consumption of the current sensor according to the embodiment of the present invention.

Under the above-described condition, the power consumption of the current sensor (indicated by Hybrid) according to the embodiment of the present invention is illustrated in FIGS. 3 and 4. FIG. 4 is an enlarged diagram illustrating the part in which the switching is performed in FIG. 3. As clear from FIGS. 3 and 4, the detection mode is switched by using a measurement current value of 20 A as a threshold, whereby an advantage of the magnetic balance detection that high-precision measurement is performed in a wide measurement range is utilized and the power consumption is decreased during measurement of a small measurement current, such as during a stop of a car.

In the above description, the power consumption of the current sensor is focused, and the feedback current in the magnetic balance mode is turned on/off. In addition to the turning on/off of the feedback current, a circuit is configured in such a manner that a gain of the differential amplifier 121 connected to the bridge circuit 112 can be varied by using, for example, a programmable gain amplifier (PGA), enabling the measurement resolution to be increased for a small measurement current. For example, when the current sensor is used for an automobile battery, measurement precision is increased with this configuration in standby current during idling or a stop of a car which is being driven, achieving an effect that the efficiency of battery charge and discharge management is increased.

In the case of a hybrid car, battery current is direct current. However, in the case where alternating current such as current from a household power supply is measured, the configuration according to the embodiment of the present invention can be also applied. For example, in the case where the characteristic as illustrated in FIGS. 3 and 4 is used, a threshold for the switching of the detection mode in this case may be set in such a manner that switching to the magnetic balance system is performed when the maximum value, i.e., a peak value, of the current exceeds 50% of the usable range for the magnetic proportional detection, i.e., 20 A, and that, in contrast, switching to the magnetic proportional system is performed when the maximum value of the current is within the current range in the power-saving mode, for example, lower than 10 A. The mode switching control of alternating current is different from that of direct current in that only the maximum value in the alternating-current fluctuations is used for the determination. During operation in the magnetic balance detection, the magnetic balance system operates even for all of the time periods in which a current value becomes 10 A or smaller in the alternating-current fluctuation period. This case will be described with reference to the graph of power consumption illustrated in FIG. 4. While the current sensor operates in the magnetic balance system (in the case where the maximum value of current is 20 A or larger), even during a time period in which a value of measurement current instantaneously becomes 10 A or smaller, the current sensor operates at a power for the magnetic balance detection. This prevents frequent turning on/off of the feedback current, achieving an effect that the current sensor can follow a change in current which becomes larger fast. On the other hand, a threshold which is used to switch to the magnetic proportional system and which is properly set to, for example, 10 A achieves an effect of suppression of current consumption in the power-saving mode, which is the original aim, even when an effect of suppression of current consumption during operation in the magnetic balance detection is not sufficiently achieved.

Thus, the current sensor according to the embodiment of the present invention switches between the magnetic proportional detection and the magnetic balance detection with a single configuration, achieving compatibility between a wide measurement range provided by the magnetic balance system and power saving. In particular, the present invention is effective for a current sensor using a magnetoresistive element that has a configuration in which a feedback coil is disposed close to the magnetoresistive element. Since the sensing axis of a magnetoresistive element is oriented in an in-plane direction, a coil can be formed extremely close to a magnetoresistive element in a manufacturing process of a current sensor, resulting in an advantage that a configuration can be employed in which a relatively small feedback current can produce a magnetic field that cancels a magnetic field produced by a large current.

Second Embodiment

In a second embodiment, the case will be described in which two current sensors are disposed so as to face each other with a current line which is interposed therebetween and through which measurement current flows, and in which the sensing axis directions of the magnetoresistive elements in the two current sensors are the same.

Figure 5:
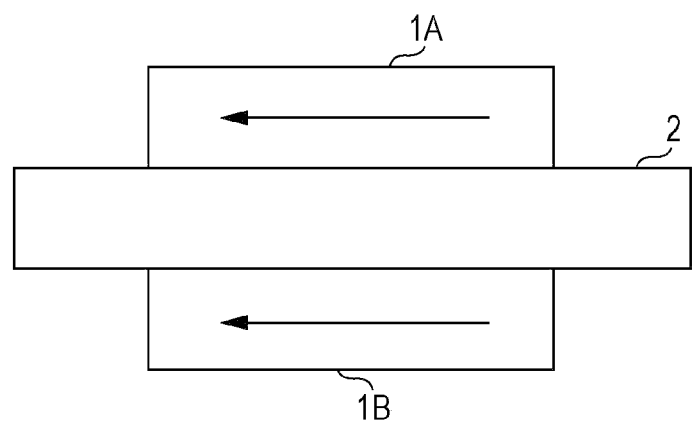
FIG. 5 is a diagram illustrating a configuration of a current sensor according to a second embodiment of the present invention.

FIG. 5 is a diagram illustrating a configuration of a current sensor according to the second embodiment of the present invention. In the configuration illustrated in FIG. 5, two current sensors 1A and 1B are disposed so as to be opposite each other with a current line 2 which is interposed therebetween and through which measurement current flows.

Figure 6:
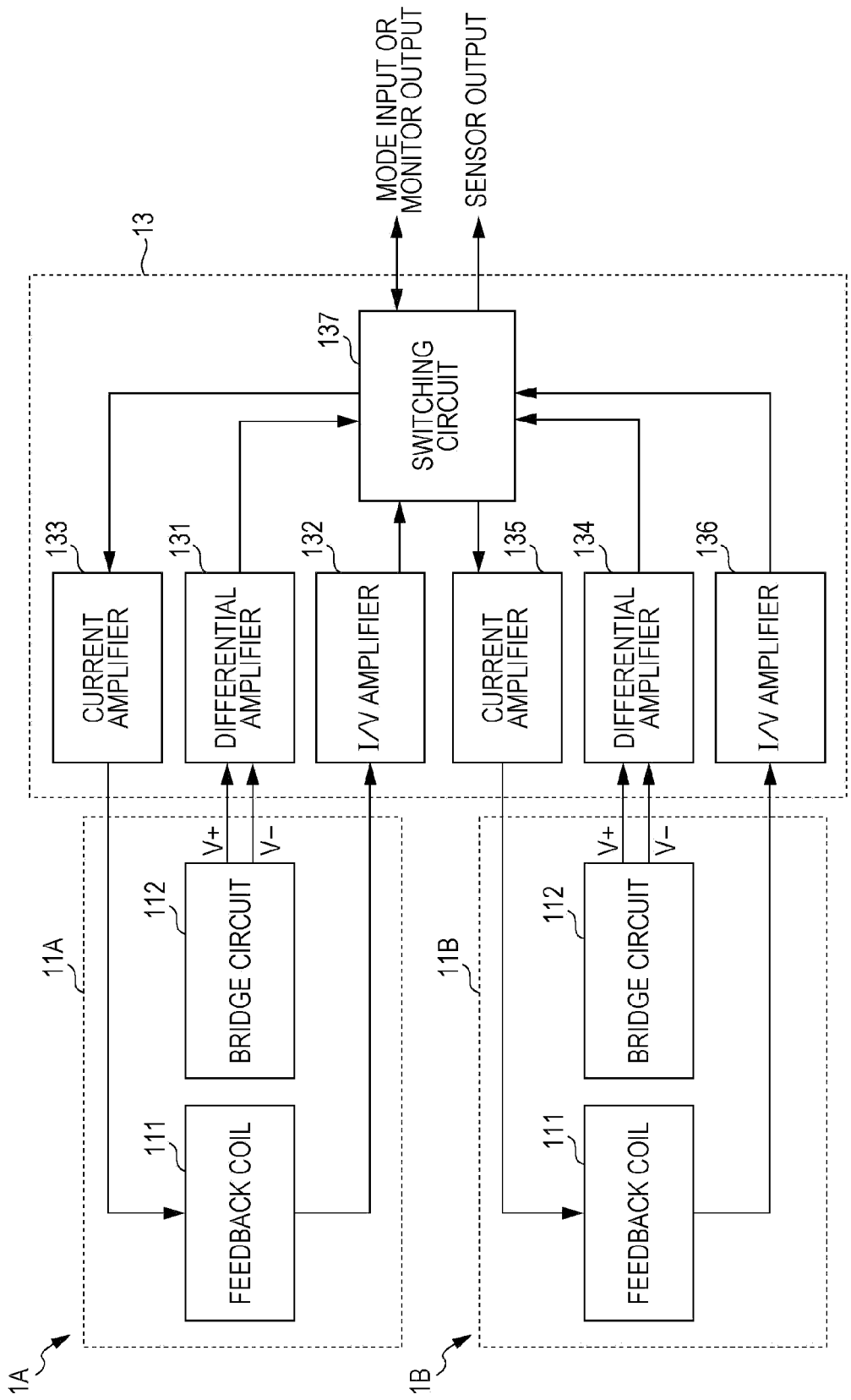
FIG. 6 is a diagram illustrating a configuration of the current sensor according to the second embodiment of the present invention.

In the current sensor as illustrated in FIG. 6, sensing units 11A and 11B each include the feedback coil 111 which winds in a direction in which a magnetic field produced by the measurement current is canceled, and the bridge circuit 112 which includes two magnetoresistive elements, which are magnetic detection devices, and two fixed resistance elements. A controller 13 includes a differential amplifier 131 which amplifies a differential output from the bridge circuit 112 in the sensing unit 11A, a current amplifier 133 which controls feedback current through the feedback coil 111 in the sensing unit 11A, an I/V amplifier 132 which converts the feedback current in the sensing unit 11A into voltage, a differential amplifier 134 which amplifies a differential output from the bridge circuit 112 in the sensing unit 11B, a current amplifier 135 which controls feedback current through the feedback coil 111 in the sensing unit 11B, an I/V amplifier 136 which converts the feedback current in the sensing unit 11B into voltage, and a switching circuit 137 which switches between the magnetic proportional detection and the magnetic balance detection.

Components in the circuits illustrated in FIG. 6 are the same as those in FIG. 1, and will not be described in detail. In the configuration illustrated in FIG. 6, the switching circuit 137 controls the current sensors 1A and 1B to be switched so that the current sensors 1A and 1B operate in the same detection mode. In the magnetic proportional mode, the switching circuit 137 outputs a differential between the voltages of the differential amplifiers 131 and 134 as a sensor output. In the magnetic balance mode, the switching circuit 137 outputs a differential between the voltages of the I/V amplifiers 132 and 136 as a sensor output. These processes cause an external magnetic field such as that of the earth to be canceled because the sensing axis directions of the magnetoresistive elements in the two current sensors 1A and 1B are the same, enabling current to be measured more precisely.

Battery Using Current Sensor

A battery using a current sensor according to an embodiment of the present invention includes a battery body which is provided with a current line, and a current sensor which is attached to the current line. Description will be made for the case in which a battery having such a configuration is managed by performing charge and discharge control, that is, by a battery management system.

Figure 7:
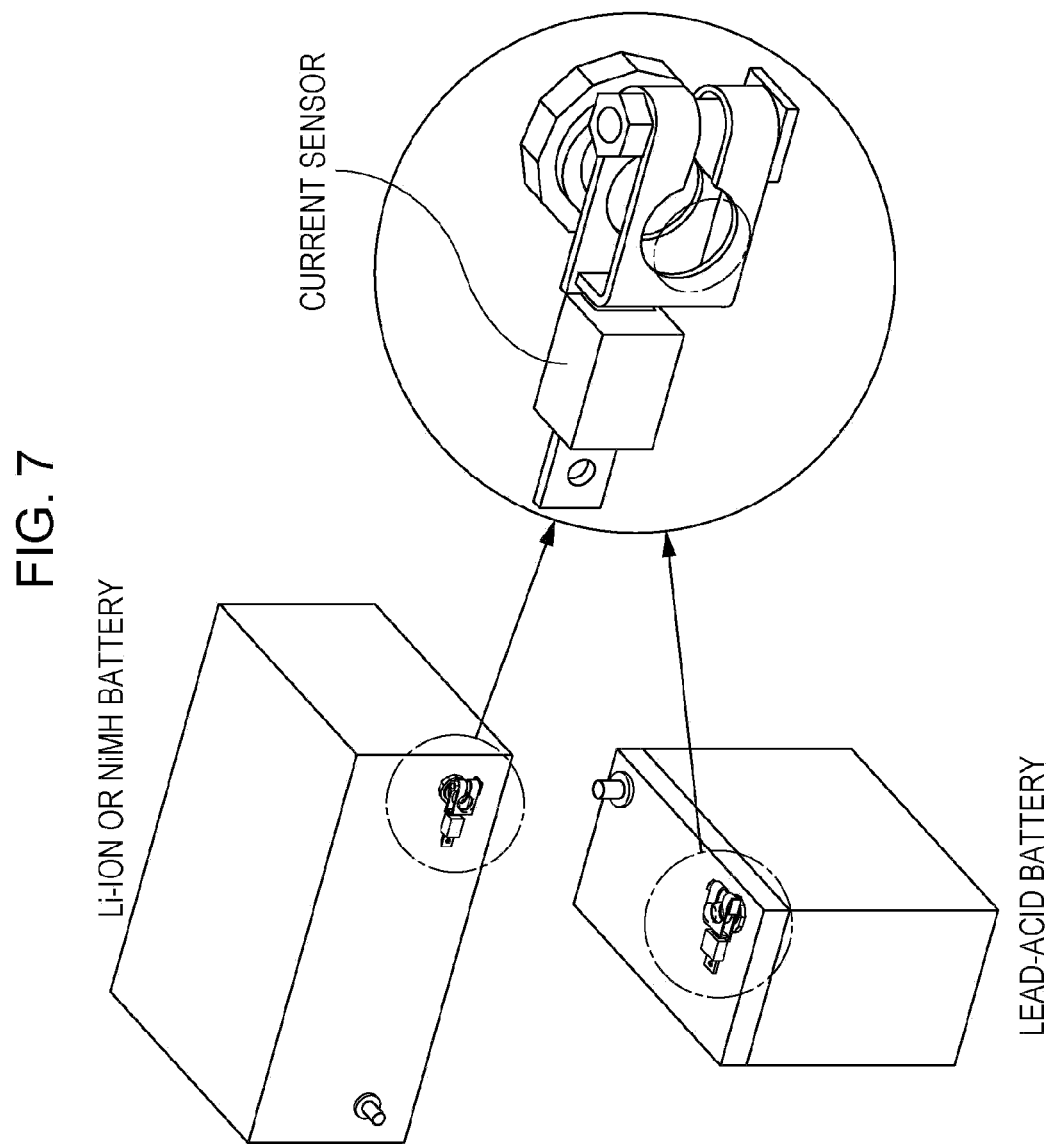
FIG. 7 is a diagram for explaining what kinds of batteries are used when a current sensor according to an embodiment of the present invention is applied to batteries.

A current sensor described in the embodiments is provided for a battery, thereby enabling management of the battery. Specifically, as illustrated in FIG. 7, a current sensor is attached to a terminal, i.e., the positive electrode or the minus electrode, of a battery that is subjected to charge and discharge, such as a Li-ion battery, a NiMH battery, or a lead-acid battery. The current sensor is used to measure current caused by the charge and discharge in the battery, and the measurement results are summed, thereby enabling management of a remaining quantity of the battery.

The value of current which flows when the battery is used is significantly different from the value of current which flows when the battery is not used. By using a current sensor according to an embodiment of the present invention, in other word, by using the magnetic proportional detection for a low measurement current and using the magnetic balance detection for a high measurement current, a single current sensor can detect an amount of current with high precision in both the cases where the battery is used and where the battery is not used. By measuring a value of battery current with high precision, summation error can be reduced, thereby decreasing a margin which is provided for the battery in order to prevent an overcharge or an over-discharge. As a result, the battery can be efficiently used. For example, a current sensor according to an embodiment of the present invention is applied to a battery such as one in an electric car, enabling the mileage of the battery to be increased.

The present invention is not limited to the first and second embodiments, and various modifications can be made and embodied. For example, the connection relationships, the sizes, or the like of the components in the first and second embodiments may be modified as appropriate and embodied. In the embodiments described above, a magnetic balance current sensor using magnetoresistive elements is described. However, a magnetic balance current sensor using Hall elements or other magnetic detection devices may be used. In addition, the present invention can be embodied with modifications as appropriate without departing the scope of the claims.

The present invention can be applied to a current sensor which detects the magnitude of current for driving a motor in an electric car or a hybrid car.

What is claimed is:

1. A current sensor comprising:
a magnetic balance sensor including:
a magnetic sensor circuit having a magnetic sensor element varying in characteristics due to an induction field caused by a measurement current, the magnetic sensor circuit outputting a voltage difference corresponding to the induction field; and
a feedback coil disposed near the magnetic sensor element, the feedback coil producing a canceling magnetic field to cancel the induction field; and
a switching circuit configured to switch between a magnetic proportional detection mode and a magnetic balance detection mode, the switching circuit outputting, in the magnetic proportional detection mode, a voltage signal based on the voltage difference as a sensor output, and outputting, in the magnetic balance detection mode, a voltage signal corresponding to a current flowing through the feedback coil as the sensor output when the induction field and the canceling magnetic field cancel each other so as to reach a balanced state after the feedback coil is energized based on the voltage difference,
wherein the switching circuit is configured to switch to the magnetic proportional detection mode when the measurement current is in a first range including a lower end of the measurement current but not a higher end of the measurement current, and switch to the magnetic balance detection mode when the measurement current is in a second range including the higher end of the measurement current but not the lower end of the measurement current.

2. A current sensor comprising:
a pair of magnetic balance sensors disposed so as to face each other with a conductor interposed therebetween, a measurement current flowing through the conductor, the pair of magnetic balance sensors comprising:
a first magnetic balance sensor including:
a first magnetic sensor circuit having a magnetic sensor element varying in characteristics due to an induction field caused by the measurement current, the first magnetic sensor circuit outputting a first voltage difference corresponding to the induction field; and
a first feedback coil disposed near the first magnetic sensor element, the first feedback coil producing a first canceling magnetic field to cancel the induction field based on the first voltage difference;
a second magnetic balance sensor including:
a second magnetic sensor circuit having a magnetic sensor element varying in characteristics due to the induction field caused by the measurement current, the second magnetic sensor circuit outputting a second voltage difference corresponding to the induction field; and
a second feedback coil disposed near the second magnetic sensor element, the second feedback coil producing a second canceling magnetic field to cancel the induction field based on the second voltage difference; and
a switching circuit coupled to the first and second magnetic balance sensors, and configured to switch between a magnetic proportional detection mode and a magnetic balance detection mode, the switching circuit outputting, in the magnetic proportional detection mode, a voltage signal corresponding to a differential between the first and second voltage differences as a sensor output, and outputting, in the magnetic balance detection mode, a voltage value corresponding to differential between first and second currents flowing through the first and second feedback coils, respectively, as the sensor output when the induction field and the first and second canceling magnetic fields cancel each other so as to reach a balanced state in the first and second magnetic balance sensors, respectively, after the first and second feedback coils are energized based on the first and second voltage differences, respectively,
wherein sensing axis directions of the first and second magnetic sensor elements are identical.

3. The current sensor according to claim 1,
wherein the switching circuit is configured to switch between the magnetic proportional detection mode and the magnetic balance detection mode in accordance with an external signal.

4. The current sensor according to claim 1,
wherein the magnetic proportional detection mode is performed in a range of the measurement current in which linearity of magnetic characteristics of the magnetic sensor element is maintained.

5. The current sensor of claim 1,
wherein the switching circuit is further configured to output a signal indicating whether the current sensor is operated in the magnetic proportional detection mode or in the magnetic balance detection mode.

6. The current sensor according to claim 1,
wherein the magnetic sensor element is a magnetoresistive element.

7. A battery comprising:
a battery body provided with a current line; and
the current sensor according to claim 1 attached to the current line.

8. The current sensor according to claim 1,
wherein the switching circuit is configured to switch from the magnetic proportional detection mode to the magnetic balance detection mode when the measurement current exceeds a first threshold value, and to switch from the magnetic balance detection mode to the magnetic proportional detection mode when the measurement current is smaller than a second threshold value which is smaller than the first threshold value.

9. The current sensor according to claim 1,
wherein the magnetic sensor circuit is a bridge circuit.

10. The current sensor according to claim 2,
wherein the switching circuit is configured to switch to the magnetic proportional detection mode when the measurement current is in a first range including a lower end of the measurement current but not a higher end of the measurement current, and switch to the magnetic balance detection mode when the measurement current is in a second range including the higher end of the measurement current but not the lower end of the measurement current.

11. The current sensor according to claim 2,
wherein the magnetic proportional detection mode is performed in a range of the measurement current in which linearity of magnetic characteristics of the first and second magnetic sensor elements is maintained.

12. The current sensor according to claim 2,
wherein the switching circuit is configured to switch from the magnetic proportional detection mode to the magnetic balance detection mode when the measurement current exceeds a first threshold value, and to switch from the magnetic balance detection mode to the magnetic proportional detection mode when the measurement current is smaller than a second threshold value which is smaller than the first threshold value.

13. The current sensor according to claim 2,
wherein the first and second magnetic sensor circuits are bridge circuits.

* * * * *